(12) United States Patent
Hong

(10) Patent No.: US 11,315,818 B2
(45) Date of Patent: Apr. 26, 2022

(54) INLINE THIN FILM PROCESSING DEVICE

(71) Applicant: Ying Hong, Liaoning (CN)

(72) Inventor: Ying Hong, Liaoning (CN)

(*) Notice: Subject to any disclaimer, the term of this patent is extended or adjusted under 35 U.S.C. 154(b) by 32 days.

(21) Appl. No.: 17/028,327

(22) Filed: Sep. 22, 2020

(65) Prior Publication Data

US 2021/0005474 A1  Jan. 7, 2021

Related U.S. Application Data

(63) Continuation of application No. PCT/KR2019/002496, filed on Mar. 5, 2019.

(30) Foreign Application Priority Data

Mar. 23, 2018  (KR) .................. 10-2018-0034095
Feb. 7, 2019  (KR) .................. 10-2019-0014438

(51) Int. Cl.
*H01L 21/677* (2006.01)
*H01L 21/687* (2006.01)
(Continued)

(52) U.S. Cl.
CPC ...... *H01L 21/6776* (2013.01); *C23C 16/4587* (2013.01); *C23C 16/45565* (2013.01);
(Continued)

(58) Field of Classification Search
CPC .......... H01L 21/6776; H01L 21/67259; H01L 21/67709; H01L 21/68764; H01L 21/67069; H01L 21/67173; H01L 21/67103; H01L 21/68; H01L 21/67017; H01L 21/0262; C23C 16/45565; C23C 16/45574; C23C 16/45587;
(Continued)

(56) References Cited

U.S. PATENT DOCUMENTS 1,648,504 A * 11/1927 Offenbacher ........... C03C 17/10
                                                              118/56
5,820,679 A * 10/1998 Yokoyama ........ H01L 21/67161
                                                              118/719
(Continued)

FOREIGN PATENT DOCUMENTS

JP     H05-30028    4/1993
JP     5578539      8/2014
(Continued)

OTHER PUBLICATIONS

English translation of KR 10-1208660 (Year: 2012).*
(Continued)

*Primary Examiner* — Jeffrie R Lund
(74) *Attorney, Agent, or Firm* — Burris Law, PLLC

(57) ABSTRACT

A thin film processing device includes a showerhead for performing thin film processing for a substrate on a susceptor that moves along a transport track, and one or more transporters for supporting the susceptor. The transporters can transport the susceptor along the transport track while floating with respect to the track and not contacting the track, and can also control the height of the susceptor so as to adjust the distance from the substrate to the showerhead; and a transporter control system for controlling the transporters.

9 Claims, 18 Drawing Sheets

(51) Int. Cl.
*H01L 21/67* (2006.01)
*C23C 16/455* (2006.01)
*C23C 16/458* (2006.01)

(52) U.S. Cl.
CPC .. *C23C 16/45574* (2013.01); *C23C 16/45587* (2013.01); *H01L 21/67259* (2013.01); *H01L 21/67709* (2013.01); *H01L 21/68764* (2013.01); *H01L 21/67069* (2013.01); *H01L 21/67173* (2013.01)

(58) Field of Classification Search
CPC .......... C23C 16/4587; C23C 16/45544; C23C 16/45578; C23C 16/4586; C23C 16/54; C23C 16/44

See application file for complete search history.

(56) References Cited

U.S. PATENT DOCUMENTS

| | | | | |
|---|---|---|---|---|
| 9,523,150 | B2* | 12/2016 | Itatani | C23C 16/4585 |
| 2002/0076490 | A1* | 6/2002 | Chiang | C23C 16/515 |
| | | | | 427/248.1 |
| 2004/0247787 | A1* | 12/2004 | Mackie | C23C 16/40 |
| | | | | 427/248.1 |
| 2011/0290175 | A1* | 12/2011 | Paranjpe | C23C 16/4582 |
| | | | | 117/85 |
| 2013/0009177 | A1* | 1/2013 | Chang | H01L 21/6776 |
| | | | | 257/88 |
| 2014/0199788 | A1* | 7/2014 | Vermont | H01L 22/26 |
| | | | | 438/5 |
| 2016/0281233 | A1* | 9/2016 | Granneman | C23C 16/45544 |
| 2017/0067156 | A1* | 3/2017 | Leeser | C23C 14/564 |
| 2020/0189054 | A1* | 6/2020 | Mimura | H01L 21/67709 |
| 2020/0190660 | A1* | 6/2020 | Ogawa | C23C 14/042 |
| 2020/0194293 | A1* | 6/2020 | Himeji | C23C 14/54 |
| 2021/0005474 | A1* | 1/2021 | Hong | H01L 21/68 |

FOREIGN PATENT DOCUMENTS

| | | | | | |
|---|---|---|---|---|---|
| KR | 2011036445 | A | * | 4/2011 | .............. B60L 13/03 |
| KR | 2011054177 | A1 | * | 5/2011 | .............. B65G 54/02 |
| KR | 101049221 | B1 | * | 7/2011 | |
| KR | 101049222 | B1 | * | 7/2011 | |
| KR | 10-1208660 | | | 12/2012 | |
| KR | 1020130135592 | | | 12/2013 | |
| KR | 10-2014-0085947 | | | 7/2014 | |
| KR | 10-2015-0030547 | | | 3/2015 | |
| KR | 10-2015-0044107 | | | 4/2015 | |
| KR | 10-1531656 | | | 6/2015 | |
| WO | WO-2015056847 | A1 | * | 4/2015 | .............. B60L 13/04 |

OTHER PUBLICATIONS

English translation of KR 10-2014-0085947 (Year: 2014).*
International Search Report for International Application PCT/KR2019/002496, dated Jun. 7, 2019.
Office Action issued in corresponding Korean Application No. 1020190014438, dated Feb. 15, 2021.

* cited by examiner

INLINE THIN FILM PROCESSING DEVICE

CROSS-REFERENCE TO RELATED APPLICATIONS AND PRIORITY

The present application is a continuation of International Application No. PCT/KR2019/002515, filed on Mar. 5, 2019, which claims priority to and the benefit of the filing dates of Korean Patent Application Nos. 10-2018-0034098, filed on Mar. 23, 2018, and 10-2018-0014438, filed on Feb. 7, 2019, in the Korean Intellectual Property Office, the disclosures of which are incorporated herein in their entirety by reference.

TECHNICAL FIELD

The present disclosure relates to a thin film processing apparatus and relates to: an inline thin film processing method in which several processes are performed consecutively in a single transport line; and an inline thin film processing apparatus.

BACKGROUND

Through a cyclic atomic layer deposition (ALD) method, a high quality thin film having an atomic layer thickness may be formed uniformly at a low temperature on a substrate on which a pattern is formed. Such a cyclic ALD method is practically and essentially applied to obtain a high dielectric constant (high-K) of high performance semiconductor DRAM and to manufacture a super large scale integration (S-LSI) product. However, a conventional cyclic ALD method has a disadvantage in manufacturing devices of a wide-area product, for example, displays and solar cells, because a film formation rate is slow.

Spatial ALD methods have been applied to mass production of silicon solar cells and the like and received a lot of attention, but there are still limitations in wide-area expansion and multi component thin film deposition.

In a film formation method performed by reciprocating transport of a susceptor/a substrate, there are problems of generation of particles and limitations in application to a wide-area product. Also, frequent mechanical failures occur due to repeated acceleration and stop of a transporting device.

In a turntable method utilizing circulating transport, it is not easy to ensure uniformity of film formation, and it is difficult to expand a large area corresponding to a large display.

According to an exemplary embodiment, provided are an inline thin film processing method and an inline thin film processing apparatus, which exhibit an improved thin film deposition rate and are suitable to manufacture a wide-area product.

According to an exemplary embodiment, provided are an inline thin film processing method and an inline thin film processing apparatus, which are advantageous for wide-area expansion and multi component thin film deposition.

An inline thin film processing apparatus according to an exemplary embodiment is provided with: at least one tunnel-typed processing chamber which is disposed on a circular transport track comprising a predetermined straight line section and a curved section; one or more susceptors, each of which circularly moves along the transport track and comprises a stage on which a substrate to be processed is placed; a thin film processing showerhead which performs thin film processing for the substrate on the transport track and comprises at least one or more of a source gas supply module, a purge gas supply module, a reaction gas supply module, and a gas exhaust module; and one or more transporters, each of which supports the susceptor, transports the susceptor along the transport path while floating with respect to the track and not contacting the track, and controls a height of the susceptor to adjust the distance from the substrate to the showerhead.

According to an exemplary embodiment, the transporter may have a structure of a magnetic levitation-type linear motor, a driving coil may be provided on the track, and a permanent magnet corresponding to the driving coil may be provided in the transporter.

According to an exemplary embodiment, the control system may control the linear motor of the transporter to perform all control including speeds and directions in the inline processing device.

According to an exemplary embodiment, a position detection sensor may be provided in the susceptor to detect a position of the susceptor inside the chamber.

According to an exemplary embodiment, a magnetic bumper is provided in the susceptor to prevent a collision with another susceptor using magnetic repulsion.

According to an exemplary embodiment, the one susceptor may be supported by a plurality of transporters.

According to an exemplary embodiment, the transporter may include a support part to support the susceptor, the support part may be installed such that rotation relative to the transporter is controlled, and the support part may allow the susceptor to rotate relative to the transporter while the susceptor is transported on the curved section.

According to an exemplary embodiment, the gas module may include: a nozzle body which has a gas input path for spraying a relevant gas to the substrate and a return path; and a rotary nozzle head which is rotatably installed to the nozzle body and includes an internal gas path connected to the gas input path and gas discharge holes for discharging the gas to the outside, wherein one of the substrate supported by the susceptor and the return path of the nozzle body is selected according to the rotation of the gas discharge holes, and the gas introduced therein is moved to the selected one.

According to an exemplary embodiment, the transporter for transporting the susceptor along the track inside channel moves while floating with respect to the track and not contacting the track. Such a structure suppresses as much as possible the generation of vibration and particles occurring in an existing mechanical moving structure.

According to an exemplary embodiment, the number of the transporters is adjusted depending on the size of the susceptor, and a plurality of the transporters may be applied to one susceptor, thereby achieving enlargement of the substrate.

According to an exemplary embodiment, since the height of the susceptor may be adjusted, the distance between the substrate and nozzles may be controlled, and the distance may be adjusted in microns by precise control.

DETAILED DESCRIPTION

Figure 1:
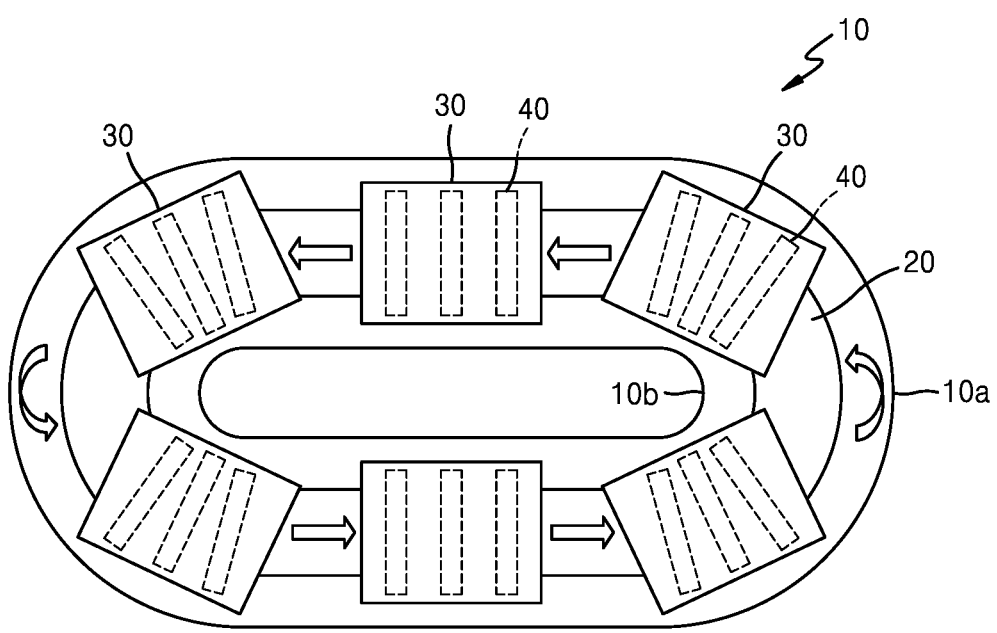
FIG. 1 schematically shows a planar configuration of a thin film processing apparatus according to an exemplary embodiment.

Hereinafter, an inline thin film processing apparatus according to exemplary embodiments will be described with reference to the accompanying drawings. The embodiments may, however, be embodied in many different forms and, the scope of the present disclosure should not be construed as being limited to the following embodiments. Rather, the exemplary embodiments of the present disclosure are provided to more fully explain the present disclosure to those having ordinary knowledge in the art. Like reference numerals refer to like elements throughout. Furthermore, various elements and regions in the drawings are schematically illustrated. Thus, the present disclosure is not limited to relative sizes or intervals illustrated in the accompanying drawings.

Although terms as first, second, etc., are used to describe various components, these components should not be limited by these terms. These terms are only used to distinguish one element from another element. For example, a first component may be referred to as a second component, and similarly, a second component may be referred to as a first component without departing from the scope of the present disclosure.

In the present application, the terms are used only for explaining specific embodiments and not intended to limit the present disclosure. The singular forms include the plural forms unless the context clearly indicates otherwise. In the present application, it should be understood that the term "include" or "comprise" used herein specifies the presence of stated features, numbers, steps, operations, components, elements, or combinations thereof, but does not preclude the presence or addition of one or more other features, numbers, steps, operations, components, elements, or combinations thereof.

Unless otherwise defined, all terms used herein including technical terms or scientific terms have the same meanings as those generally understood by a person with ordinary skill in the art to which the present disclosure pertains. Also, terms as defined in a commonly used dictionary should be construed as having the same meaning as in an associated technical context, and are not to be interpreted to have excessively formal meaning unless clearly defined in the present disclosure.

When a certain embodiment may be implemented differently, a specific process order may be performed differently from the described order. For example, two consecutively described processes may be performed substantially at the same time or performed in an order opposite to the described order.

In the drawings, for example, according to the manufacturing technology and/or tolerance, the modification of the illustrated shape may be expected. Thus, the embodiments of the present disclosure must not be interpreted to be limited by a particular shape that is illustrated in the drawings and must include a change in the shape occurring, for example, during manufacturing. The term "and/or" used herein includes each of the mentioned components and one or more combinations thereof. Also, the term "substrate" used in the specification may refer to the substrate itself or a stack structure inducing the substrate and a predetermined layer or film formed on the surface of the substrate. Also, in the specification, a "surface of a substrate" may refer to an exposed surface of the substrate itself or an outer surface of a predetermined layer or film formed on the substrate.

FIG. 1 schematically shows a planar configuration of a circulation-type chamber having a track in a thin film processing apparatus according to an exemplary embodiment, and one process or multiple circulation processes are continuously performed on the track.

As illustrated in FIG. 1, a chamber 10 has an elongated circular-shaped circulation path having two parallel straight line sections and curved sections on both sides of the straight line sections. A circular transport track 20 is installed on the bottom center inside the chamber 10. The track 20 may be modified or developed in various forms. A susceptors 30 on which a substrate in process is mounted is positioned along the track 20. A transporter 40 which flies along the track 20 is provided below the susceptor 30. The susceptor 30 is a part on which a substrate is mounted and has therein a heater to heat the substrate. The substrate may be fixed by vacuum suction or electrostatic force, or, in some cases, may be inserted and fixed into a substrate mounting groove formed on a surface of the susceptor 30.

The transporter 40 moves while floating over the track 20 by a magnetic levitation structure and the like. The transporter 40 may utilize a magnetic levitation method and thus may have a structure of a magnetic levitation-type linear induction motor (hereinafter, referred to a linear motor). The linear induction motor may be moved in a predetermined direction under control of a control device that controls the overall system. The speed of the transporter 40 or the susceptor 30 may be adjusted by controlling the linear motor.

A susceptor transport structure using the linear motor does not cause friction and vibration, and thus, problems due to friction and vibration may be significantly solved. The structure of the linear motor may be designed to be suitable for a rail structure provided in the track according to a well-known technique. The transporter is controlled by a transporter control system separately provided, and this control system may be controlled by the overall control system that controls the entire thin film processing.

Figure 2:
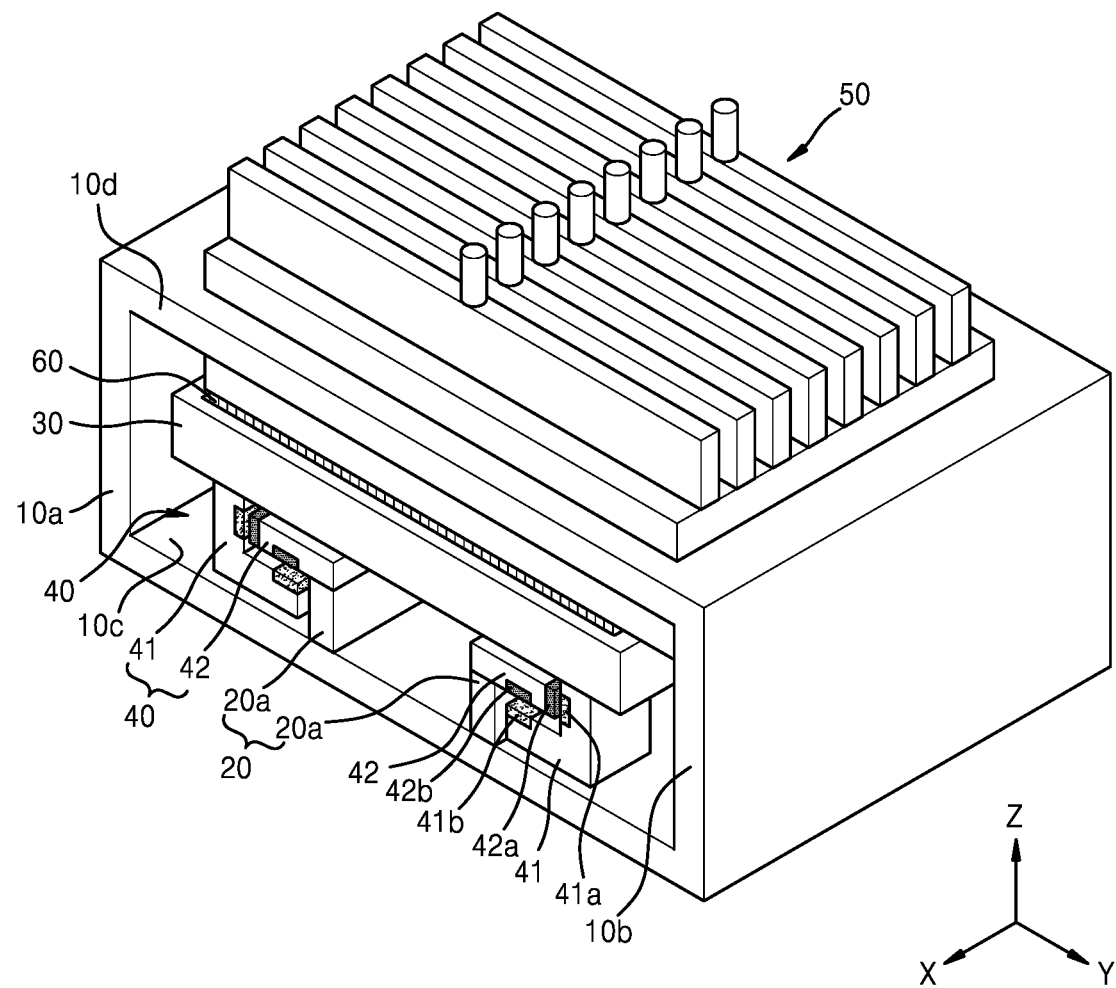
FIG. 2 is a schematic cross-sectional view showing a portion of a transporter applied to the device illustrated in FIG. 1.

FIG. 2 is a schematic partial cross-sectional view that shows the inside of a channel to show a partial structure of a transporter 40 utilizing the linear motor described above, and FIG. 3 is a schematic front view of the transporter 40.

Figure 3:
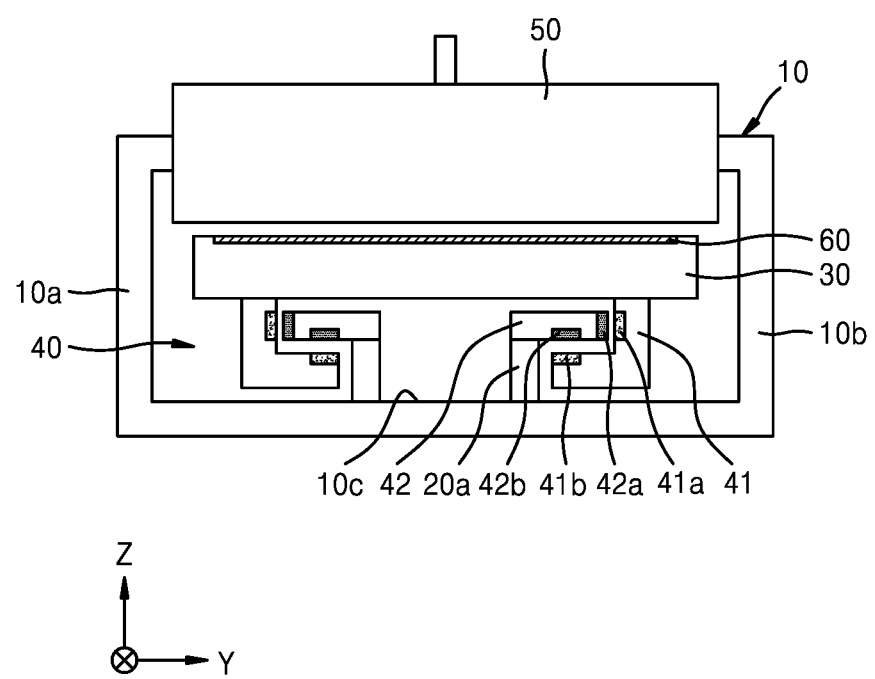
FIG. 3 is a schematic front view showing a portion of the transporter applied to the device illustrated in FIG. 1.

As illustrated in FIGS. 2 and 3, a chamber 10 is provided with a bottom 10c on which a track 20 including two bilaterally symmetrical rails 20a and 20a is installed, a ceiling 10d on which a showerhead 50 for thin film processing is installed, and wall bodies 10a and 10b on both sides. According to an exemplary embodiment, the two rails may be used when a susceptor 30 on which a substrate is mounted is large, and the one rail may be used when small.

A quadrangular or circular substrate 50, which is to be processed and faces the showerhead 50 with narrow gap, is installed on the susceptor 30, and transporters 40, which move along the rails 20a and 20a of the track 20, are installed below the substrate 50.

The transporters 40 have a symmetric linear motor configuration corresponding to both the rails 20a and 20a. That is, each of the transporter 40 includes a moving part 41 having a permanent magnet array and a static part 41 (or a stator) having a driving coil corresponding to the moving part 41. The transporters 40 including the moving part 41 and the static part 42 are formed symmetrically on both sides of the bottom of the susceptor 30.

As illustrated in FIG. 3, above each vertical rail 20a is provided a coil fixing plate 42 having a horizontal driving coil 42a and a vertical driving coil 42b which form a horizontal magnetic field and a vertical magnetic field, respectively, as elements constituting a horizontal driving part and a vertical horizontal driving part. In the moving part 41, there are provided with a horizontal driving magnet 41a and a vertical driving magnet 41b which correspond to the horizontal driving coil 42a and the vertical driving coil 42b, respectively. The horizontal driving coil 42a and the horizontal driving magnet 41a belong to the horizontal driving part, and the vertical driving coil 42b and the vertical driving magnet 41b belong to the vertical driving part.

Figure 4:
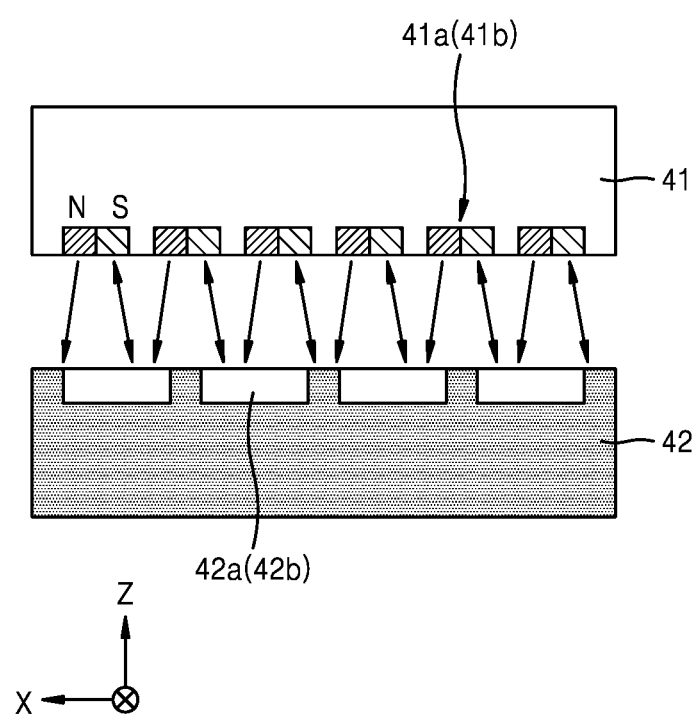
FIG. 4 schematically illustrates arrangement of driving coils and permanent magnets of a transporter applied to an exemplary embodiment.

FIG. 4 schematically illustrates driving coils and permanent magnets arranged in a progress direction of a linear motor. The configuration of FIG. 4 is applied in a structure of typical linear induction motor using magnetic repulsion between the magnets and the coils. In FIG. 4, arrows indicate directions of repulsive force due to the mutual repulsion between the coils and the magnets. Such a structure may be modified and improved on the basis of various well-known techniques for a magnetic levitation linear motor.

Figure 5:
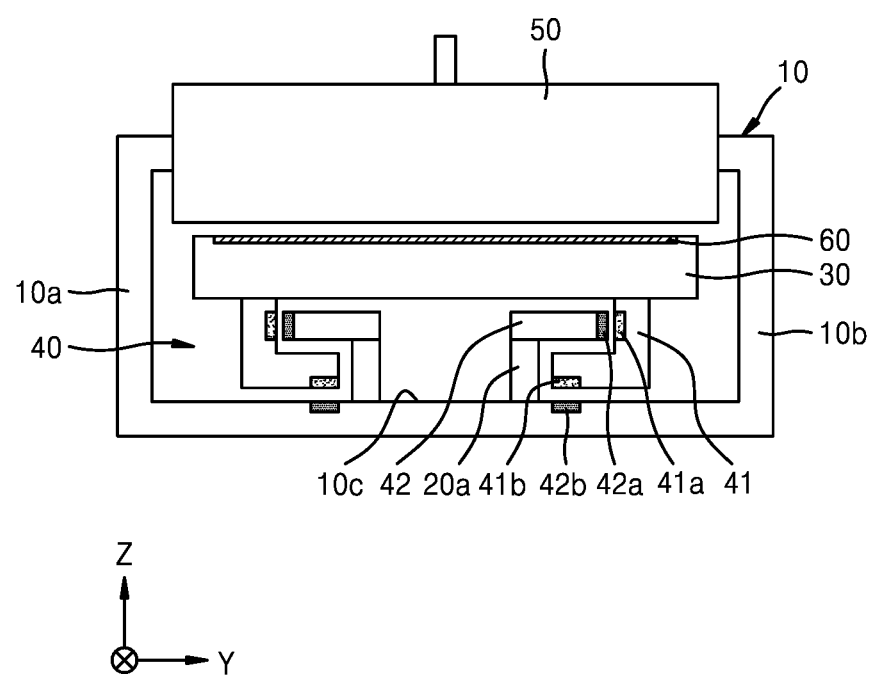
FIG. 5 shows vertical floating of a susceptor and horizontal alignment with respect to a track by a horizontal driving part and a vertical driving part of a transporter in an exemplary embodiment.

FIG. 5 illustrates vertical floating and horizontal alignment of the susceptor 30 with respect to a track, which are made by the horizontal driving coil 42a and the vertical driving coil 42b together with the horizontal driving magnet 41a and the vertical driving magnet 41b corresponding thereto of the horizontal driving part and the vertical driving part.

In the horizontal direction, the susceptor 30 is aligned with the center of the track by the horizontal driving coils 42a and the horizontal driving magnets 42a facing the same, which are arranged symmetrically to each other on both sides below the susceptor 30. In the vertical direction, the susceptor 30 may float to a predetermined height due to the magnetic repulsion between the vertical driving magnets 41b and the vertical driving coils 42b corresponding the same. Here, a distance between the substrate 60 and the showerhead 50 may be controlled by adjusting a degree of the vertical floating. In detail, the distance between the substrate and the showerhead may be controlled within a range of several microns by finely adjusting the floating height of the susceptor 30 with the vertical driving part.

Figure 6:
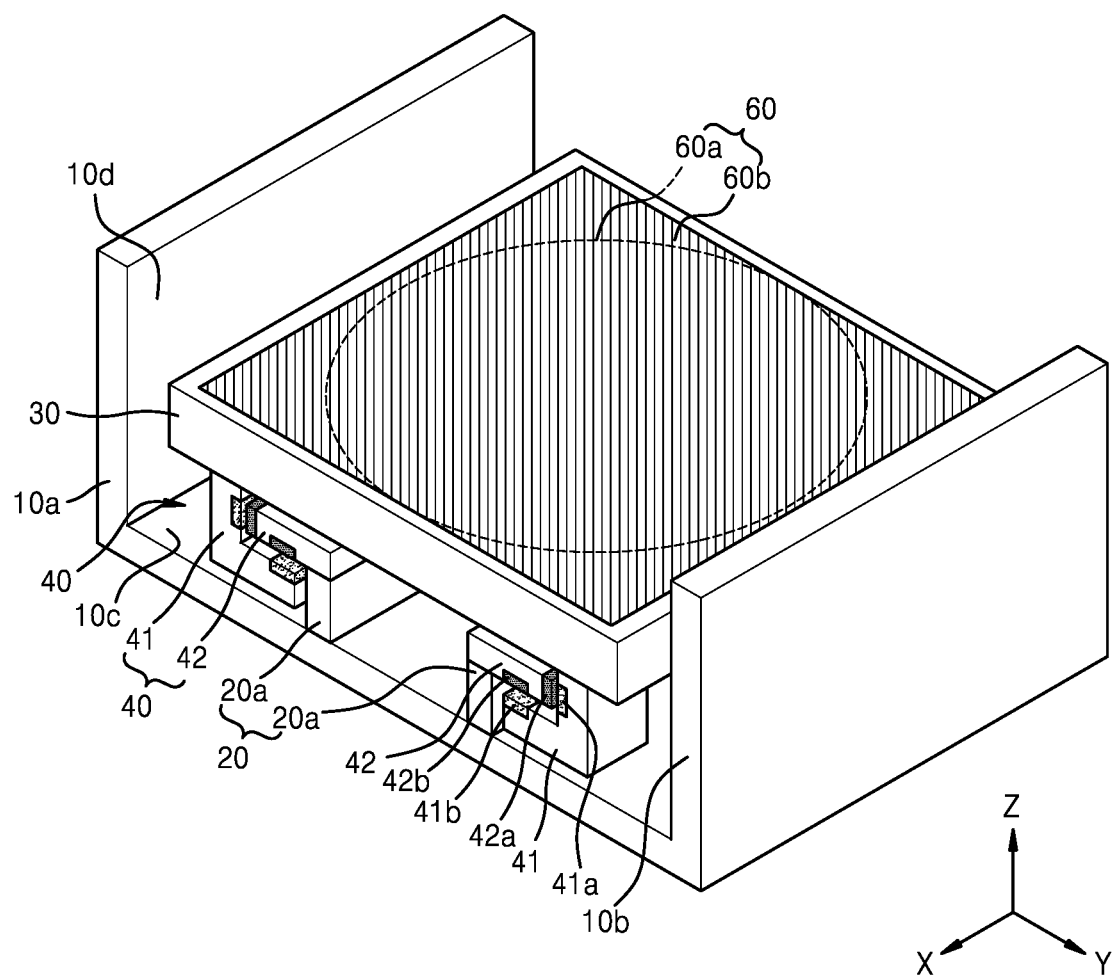
FIG. 6 illustrates a state in which a circular wafer or a quadrangular panel is mounted to a susceptor in an exemplary embodiment.

FIG. 6 illustrates a state in which a circular wafer 60a or a quadrangular panel 60b is mounted, as the substrate 60, on the susceptor 30 mounted on the transporter 40 of the magnetic levitation-type as described above.

Figure 7:
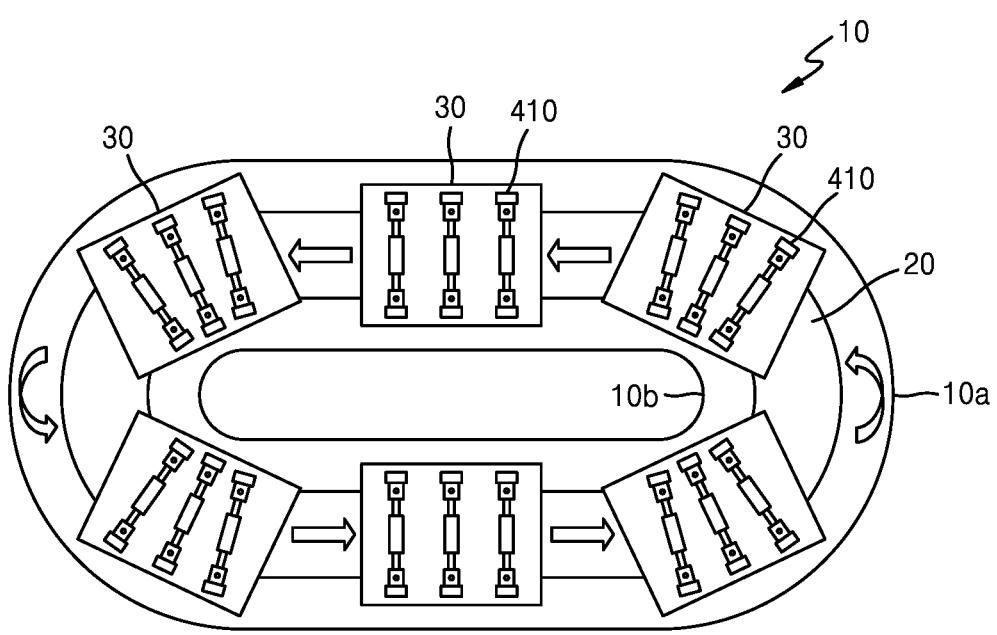
FIG. 7 schematically shows a planar configuration of a thin film processing apparatus according to an exemplary another embodiment.

FIG. 7 schematically shows a planar configuration of a thin film processing apparatus according to an exemplary another embodiment. The thin film processing apparatus of FIG. 7 has a configuration in which a plurality of transporters 410 are arranged in one susceptor 30 as in a vehicular wheel system.

Referring to FIG. 7, as illustrated in the configuration of FIG. 1, a chamber 10 has an elongated circular-shaped circulation path having two parallel straight line sections and curved sections on both sides of the straight line sections. A circular track 20 is installed on the bottom center inside the chamber 10, and a plurality of susceptors 30 on which substrates are mounted are placed on the track 20. On a lower side of the susceptor 30, the plurality of transporters 410 flying along the track 20 are installed in front and rear portions of the susceptor 30 and the central portion therebetween.

The transporter 410 may have the structure of the linear induction motor as described above. Also, according to another embodiment, only one transporter 410 is installed on one susceptor 30 when the size of the susceptor 30 is small.

Figure 8:
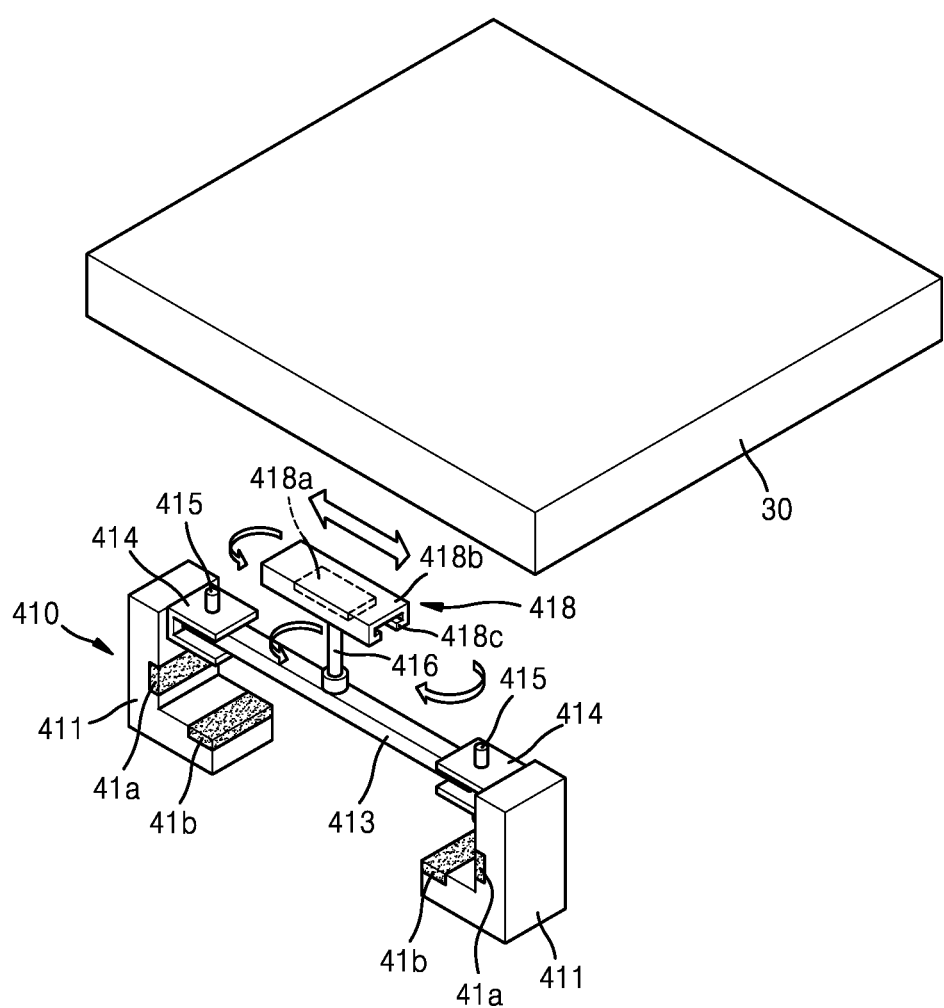
FIG. 8 shows, in three dimensions, a schematic structure of a transporter illustrated in FIG. 7.

FIG. 8 shows, in three dimensions, a schematic structure of the transporter 410 mentioned in the illustration of FIG. 7.

Referring to FIG. 8, the transporter 410 includes L-shaped moving frames or moving parts 411 and 411 formed symmetrically on both sides of a rail 20b. Horizontal and vertical driving magnets 41a and 41b as described above are installed in each of the L-shaped moving parts 411 and 411. These L-shaped moving parts 411 and 411 are connected to each other by a support arm 413 that is link-coupled. The both ends of the support arm 413 are connected through pivots 414 provided on both L-shaped moving parts 411 and 411, and thus, the support arm 413 may rotate relative to the L-shape moving parts. A susceptor support bar 416 self-rotatably stands from the center of the support arm 413, and a slider assembly 418 allowing the susceptor 30 to rotate and move in one direction is provided at an upper end of the susceptor support bar 416. The slider assembly 418 includes a sliding guide plate 418a and a sliding base 418b which slide relative to each other.

Figure 9A:
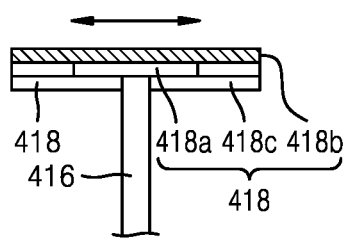
FIG. 9A is a transverse cross-sectional view of a coupling structure of a guide plate and a sliding base.
Figure 9B:
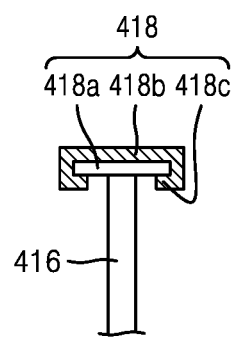
FIG. 9B is a longitudinal cross-sectional view of the coupling structure of the guide plate and the sliding base.

FIG. 9A is a transverse cross-sectional view of a coupling structure of the guide plate 418a and the sliding base 418b, and FIG. 9B is a longitudinal cross-sectional view of the coupling structure of the guide plate 418a and the sliding base 418b.

Referring to FIGS. 9A and 9B, the guide plate 418a is mounted slidably on a linear motion guide part 418c below the sliding base 418b. Thus, the sliding base 418b may reciprocate relative to the guide plate 418b in one direction.

According to the rotation and reciprocation structure of the susceptor described above, the position of the susceptor 30 may be changed in the horizontal direction by the sliding base 418b, and the susceptor 30 may be rotated by the rotatable susceptor support bar 416 having an upper end on which the guide plate 418a is fixed. Thus, the susceptor 30 may rotate and change a position in the horizontal direction with respect to the transporter 410. Although not shown in the drawings, electromagnets are disposed on both ends of the guide plate, and thus, the sliding base may return to the center position when the sliding base moves in the straight line sections. To avoid complexity in the drawing and assist the understanding of the present disclosure, the plate and the sliding base may be omitted in the following drawings.

Figure 10:
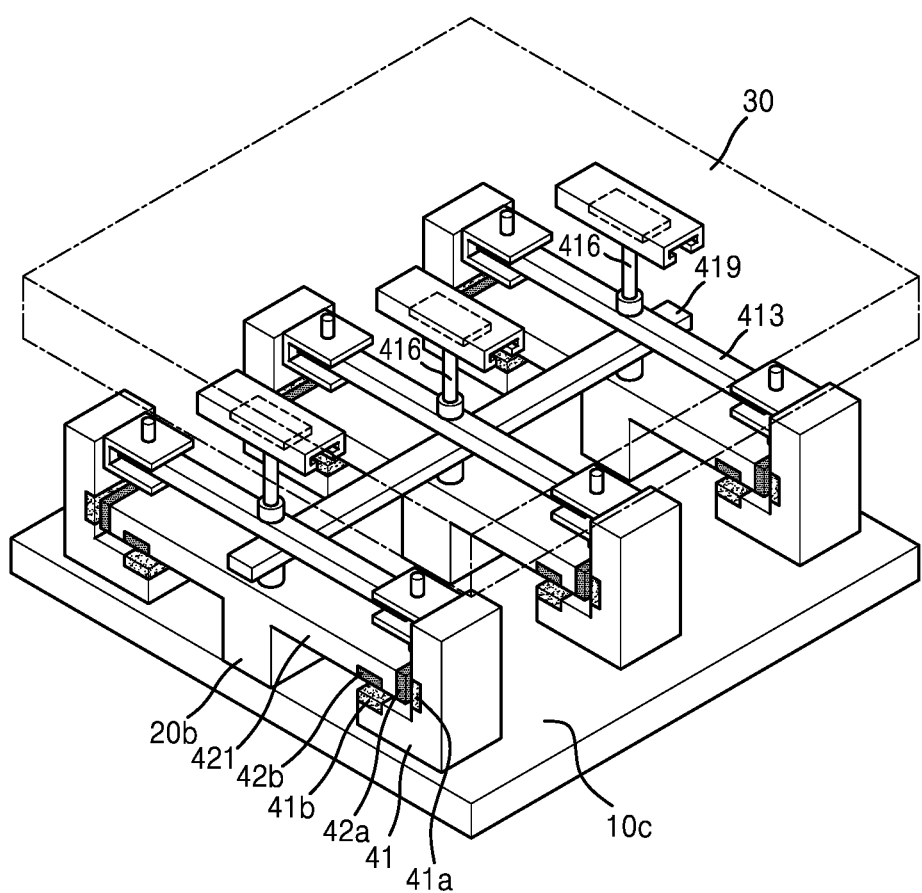
FIG. 10 is a perspective view showing a configuration in which a plurality of transporters are installed in one susceptor according to an exemplary embodiment.
Figure 11:
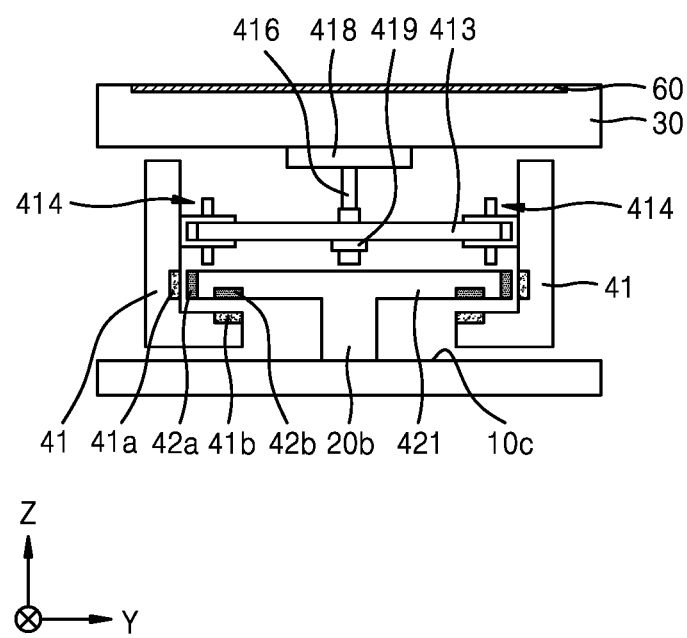
FIG. 11 is a front view showing a configuration in which a plurality of transporters linked with one susceptor according to an exemplary embodiment are installed.

FIG. 10 is a perspective view showing a structure in which a plurality of transporters 410 are installed on one susceptor 30 as mentioned in the illustration of FIG. 7, and FIG. 11 is a front view of the structure.

Referring to FIGS. 10 and 11, a vertical single rail 20b is formed in the bottom center of a chamber 10, and a horizontal platform 421 is installed above the rail 20b. Both ends of the platform 421 serve as static parts corresponding to the L-shaped moving parts 41 and 41. To this end, a horizontal driving coil 42a and a vertical driving coil 42b corresponding to horizontal and vertical driving magnets of each of both L-shaped moving parts 41 and 41 are installed at the corresponding positions of each of both ends of the static part platform 421.

Here, the plurality of transporters 410 corresponding to the one susceptor 30 are not illustrated in the drawing but may be linked to each other by an appropriate link structure. In FIGS. 10 and 11, a reference number "419" indicates a connection arm that connects the plurality of transporters 410. This arm serves as one element of the link structure. The connection arm 419 maintains a constant distance between the transporters 410 and allows each of support bars 416 and support arm 413 to rotate.

Figure 12:
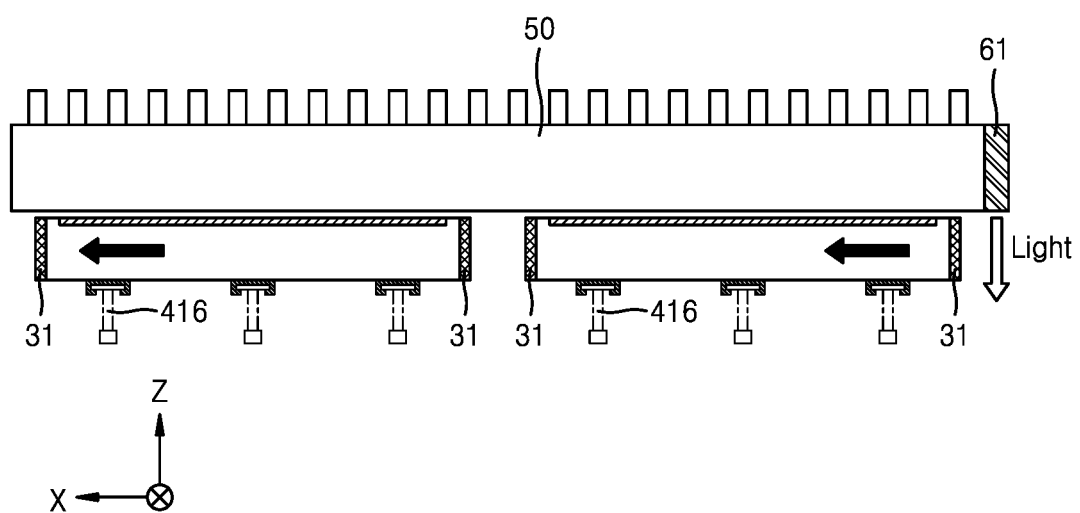
FIG. 12 illustrates a configuration for collision prevention between susceptors and individual position detection of the susceptors according to an exemplary embodiment.
Figure 13:
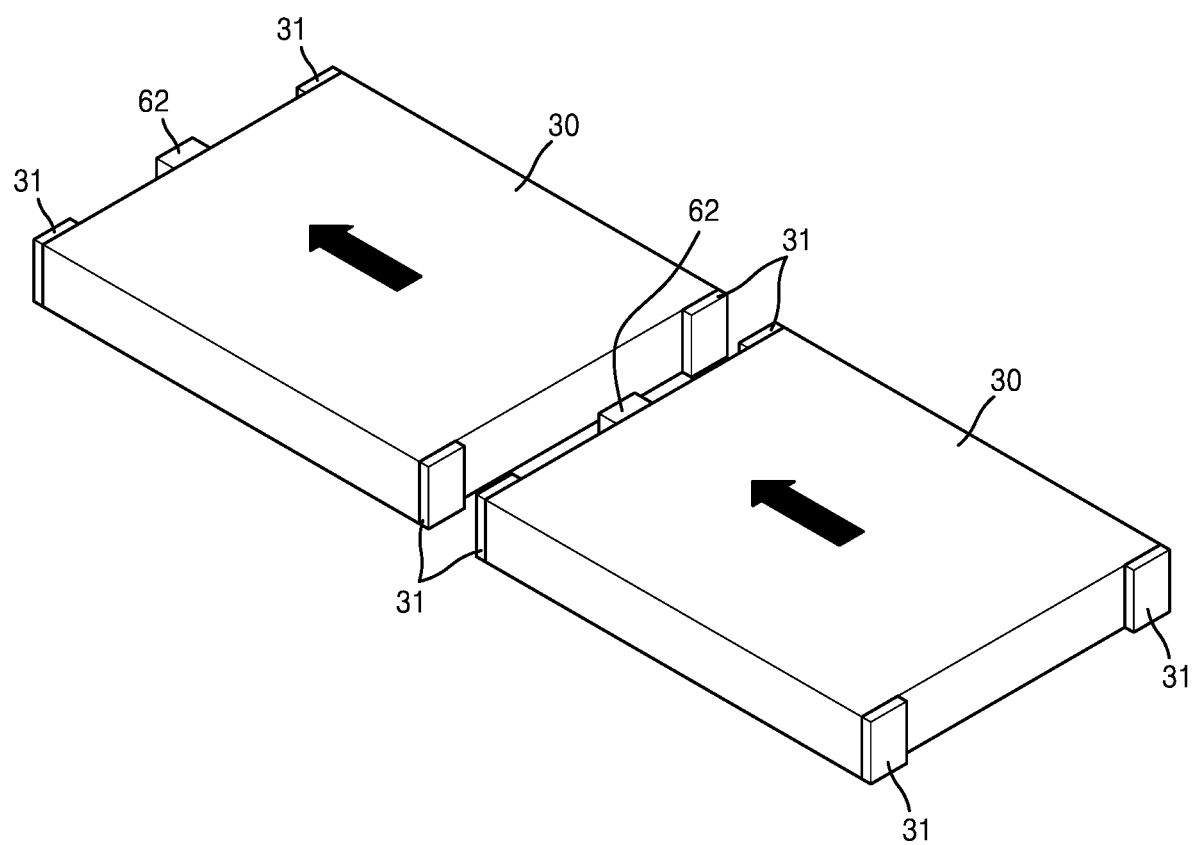
FIG. 13 is a partial perspective view of susceptors provided with collision prevention between the susceptors according to an exemplary embodiment.

FIG. 12 illustrates a susceptor equipped with a collision prevention bumper and a position detection sensor for preventing collision between susceptors and individually detecting positions of the susceptors, and FIG. 13 schematically and partially illustrates two neighboring susceptors on which the collision prevention bumper and the sensor are mounted.

First, referring to FIGS. 12 and 13, collision prevention bumpers 31 using repulsion of magnets 31 are installed on both side ends of each of two susceptors 30 passing below a showerhead 50. Here, a pilot light source 61, which provides information about the position of a susceptor 30 when the susceptor 30 passes, is provided on one side of the showerhead 50, and a sensor 62 receiving the information is provided in each of the susceptors 30. A collision prevention bumper 31 of a susceptor 30 and a collision prevention bumper 31 of adjacent another susceptor 30 are away from each other due to mutual magnetic repulsion, and thus, collision between the susceptors 30 proceeding on the track may be prevented.

The sensor 62 provided in the susceptor 30 identifies the position relative to the showerhead 50 and uses the position information. Thus, for example, relevant processes for a thin film in film formation or etching are allowed to be performed only in an effective deposition zone of a gas nozzle array of the showerhead 50.

It is desirable to use an optical method in which the light source and the sensor are used to determine the position of the susceptor for the thin film processing described above. However, existing well-known other techniques such as a mechanical or electrical interrupt method may be applied.

Figure 14:
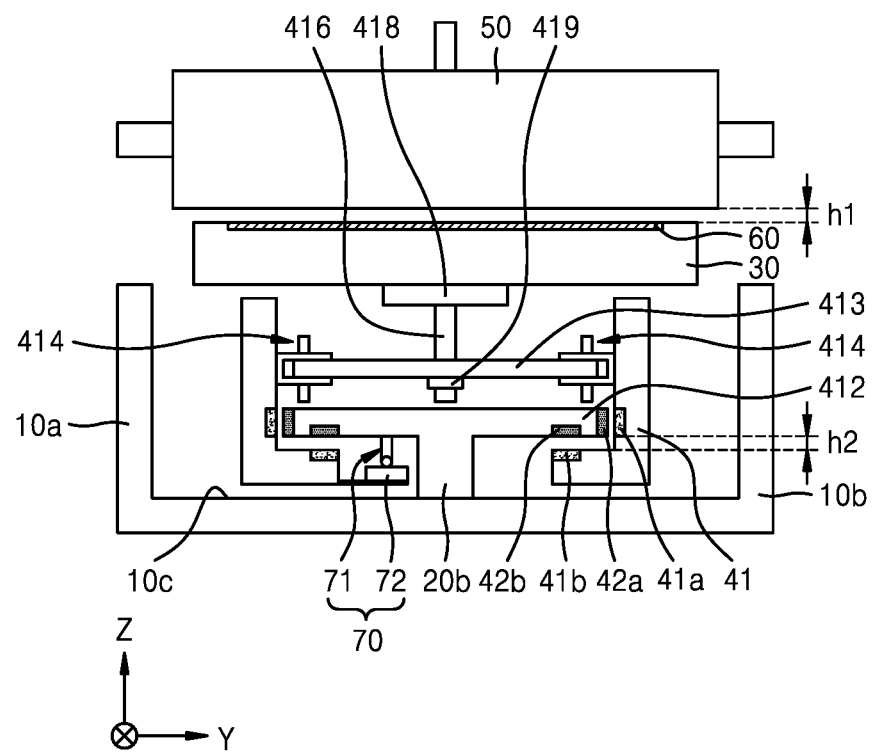
FIG. 14 shows adjustment of a process gap due to adjustment of a height of a susceptor by a vertical driving structure (a height adjustment structure) of a transporter according to an exemplary embodiment.

FIG. 14 shows adjustment of a process gap h1 due to height adjustment h2 of a susceptor 30 by a vertical driving structure (a height adjustment structure) of a transporter 40. According to an exemplary embodiment, the transporter 40 also performs height adjustment of the susceptor 30 as described above.

As illustrated in FIG. 14, the height adjustment of the susceptor 30 means gap adjustment with nozzles of the showerhead 50 and is performed by a magnetic levitation method according to an exemplary embodiment, that is, by the vertical driving coil 42b and the vertical driving magnet 41b described above. Here, the levitation height may be finely controlled in microns by adjusting driving voltage for the vertical driving coil 42b. This vertical height control may be performed by a control algorithm of a control system in the thin film processing apparatus. The gap h1 between the showerhead 50 and the susceptor 30 may be measured by a height measurement unit such as a sensor separately installed, and the levitation height h1 may be identified indirectly using the gap.

Here, several electrical devices may be installed in the susceptor 30, and electric power needs to be supplied thereto. This supplying of the electric power is made in a way in which, as illustrated in FIG. 14, the electric power is supplied from a lower side of the tract through a sliding-type power transmission part 70 that includes a rail-shaped power supply part 71 installed along the track and a pantograph-type power reception part 72 sliding on the power supply part 71 (a supply rail).

Figure 15:
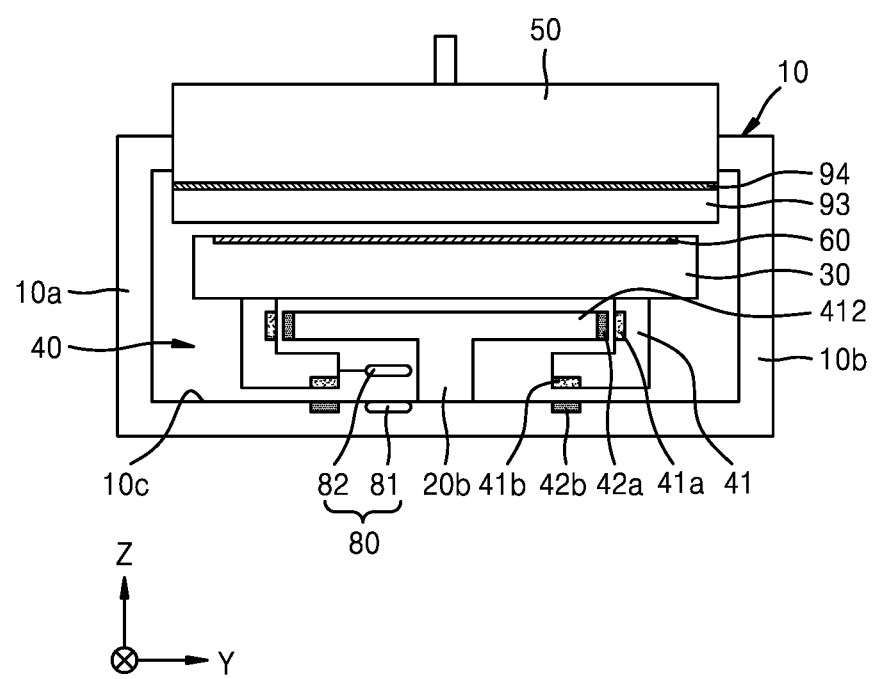
FIG. 15 illustrates a wireless power transmission part that adopts a method for wirelessly transmitting electric power to be supplied to a susceptor according to an exemplary embodiment.

FIG. 15 illustrates a wireless power transmission part 80 that adopts a method for wirelessly transmitting electric power to be supplied to a susceptor 30.

The wireless power transmission part 80 utilizes a method, in which electric power is transmitted by electric field induction, and includes a moving part 41 of a transporter 40, a power supply coil 81 at the bottom of a corresponding channel, and a power reception coil 82. Since such a wireless power supply part 80 has a limitation in transmitting electric power, a battery 93 for storing the electric power supplied through the power transmission part 80 may be provided below the susceptor 30. The battery 93 is protected by a thermal insulating layer below the susceptor 30 and stores the electric power supplied through the power transmission part 90. This wireless charging method may also be performed by magnetic resonance instead of magnetic induction.

Figure 16:
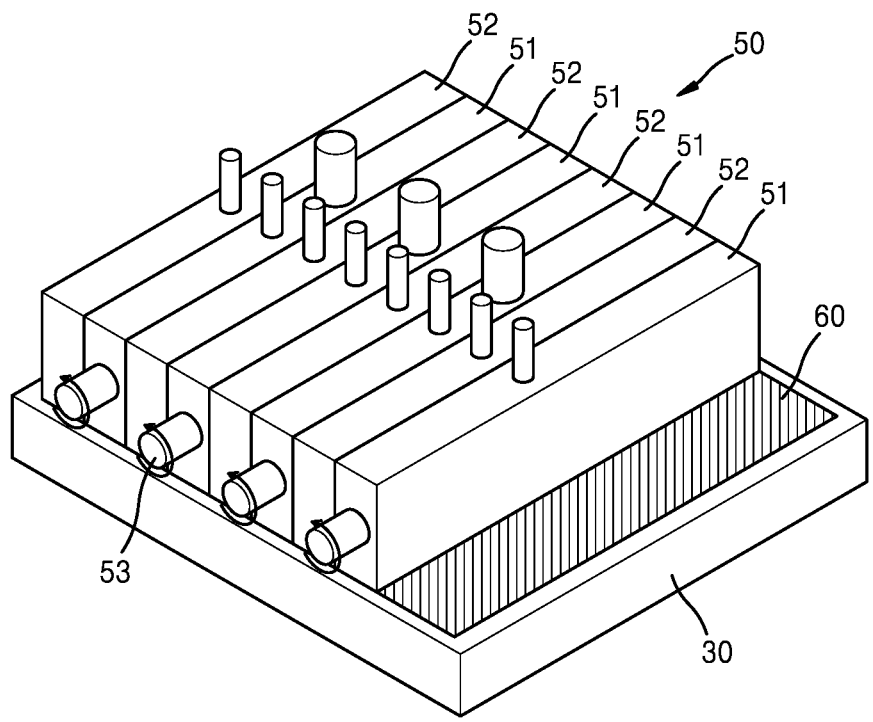
FIG. 16 is a schematic perspective view of a showerhead applied to an exemplary embodiment.

FIG. 16 is a schematic perspective view of a showerhead 50 applied to an exemplary embodiment.

The showerhead 50 for supplying a gas to a substrate 60 mounted to a susceptor 30 includes a plurality of gas nozzle heads 51, and purge gas supply heads or exhaust heads 52 may be provided between the gas nozzle heads 51. Each of the nozzle heads 51 includes a gas supply pipe 51a and a return pipe 51b, and a plurality of gas discharge ports 52 for discharging the gas are formed in a rotary valve 53.

The rotary valve 53 of the showerhead 50 regulates the supply of reaction gas depending on the positions of the susceptor 30. That is, when the susceptor 30 passes below the rotary valve 53, the reaction gas is allowed to be supplied toward the susceptor 53, and thus, the reaction gas is supplied to the substrate 60 on the susceptor 30. Also, when the susceptor 30 is away from the showerhead 50, the rotary valve 53 cuts off the supply of the reaction gas and makes the reaction gas return via a gas bypass therein. This may be understood in more depth through the illustration of FIGS. 17 and 18.

Figure 17:
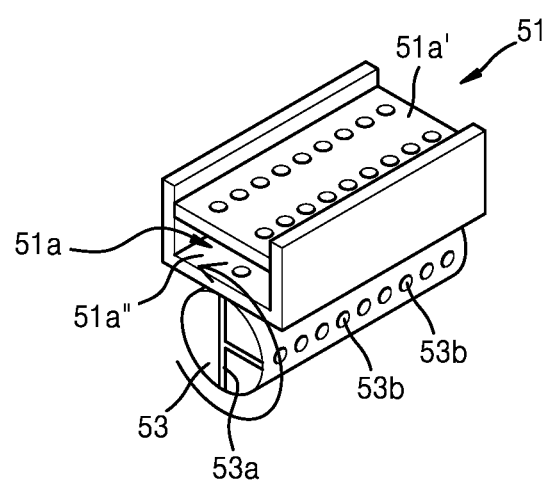
FIG. 17 schematically shows a structure of the showerhead illustrated in FIG. 16.

FIG. 17 a perspective view showing a relationship between a gas chamber 51a, which is for supplying a gas and is provided inside a body of each of a plurality of individual nozzle heads 51 provided in the showerhead 50 illustrated in FIG. 16, and a rotary valve 51b having nozzles, which allow the gas from the gas chamber 51a to be discharged to the substrate or to bypass in another direction and thereby sends the gas to a return canister.

Referring to FIG. 17, the gas injected from the outside flows into a reservoir 51a and is stored therein, and the gas stored in the reservoir 51a is cut off from the outside or is allowed to be discharged to the outside by the rotary valve 53. Filter plates 51a' and 51a", which have through-holes through which the gas is introduced and discharged so that gas ejection is uniform, are provided above and below the reservoir 51a. The rotary valve 53 has: one straight line-shaped main gas passage 53a of which an end portion is provided with an outlet for discharging the gas toward the substrate; and a gas bypass 53b extending from the middle of the main gas passage 53a. According to another exemplary embodiment, a gas outlet, facing the substrate, in the straight line-shaped main gas passage may be formed to be elongated in a slit shape.

Figure 18A:
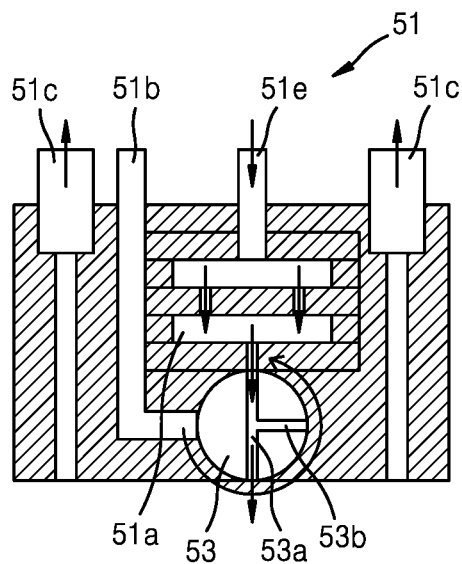
FIG. 18A shows a supply of a gas to a substrate with a rotary value located at a first position.
Figure 18B:
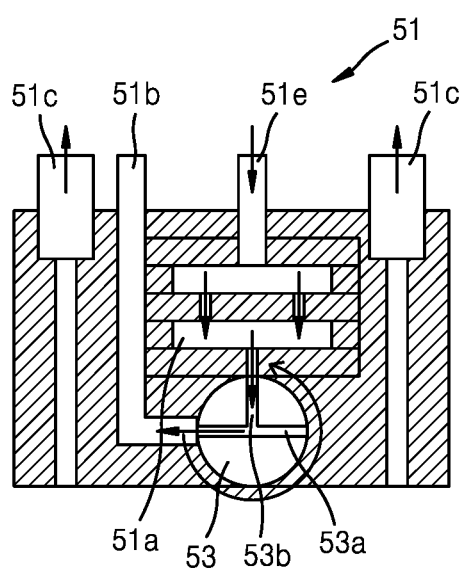
FIG. 18B shows bypass return or feeding of the gas by a rotary valve located at a second position.

FIGS. 18A and 18B schematically shows a supply of a gas to a substrate, or bypass return or feeding of the gas by the rotary valve 53. In FIG. 18A, a state is illustrated, in which the rotary valve 53 is located at a first position for supplying the gas to the substrate, and the gas from the reservoir 51a may be moved downward and discharged toward the substrate. Also, in FIG. 18B, the rotary valve 53 is located at a second position for cutting off the supply of the gas to the substrate, and the gas is fed to the outside via a bypass 51c without shutting off the gas from the chamber 51a.

According to an exemplary embodiment, the gas outlet of each nozzle head of the showerhead is provided by a rotary core shell cylinder type valve, and the gas may be supplied onto the substrate and discharged to the outside of the reservoir 51a via the bypass 51c for reuse.

The rotary valve 53 may be operated by a separate driving device and instantaneously switch injection or recovery (return) of the gas. In this operation, an operation position may be determined by a sensor and the like provided in the susceptor. This operation method may solve a problem in which a source gas flows into the reservoir and generates (produces) particles when the substrate is not present.

The track or chamber of the thin film processing apparatus according to the exemplary embodiment described above may be embodied in various forms. For example, the track or chamber may have a simple circular shape having the curved sections and straight line sections as illustrated in FIG. 1. According to another embodiment, a plurality of circular tracks for processes described above are densely packed and associated with each other, and straight line sections and curved sections are arranged in various forms depending on design conditions. A load lock chamber is provided between the chambers for processes, and thus, the substrate may be transported to another chamber without being exposed to the atmosphere.

A method of manufacturing a semiconductor device according to an embodiment of the present invention has been described with reference to the embodiment illustrated in the drawings for better understanding, but the embodiments are mere illustrative. Therefore, those of ordinary skill in the art will understand that various modifications and equivalent other embodiments are possible therefrom. Therefore, the true technical protection scope of the present invention should be determined by the appended claims.

What is claimed is:

1. A thin film processing apparatus comprising: at least one tunnel-typed processing chamber which is disposed on a circular transport track comprising a predetermined straight line section and a curved section; one or more susceptors, each of which circularly moves along the transport track and comprises a stage on which a substrate to be processed is placed; a thin film processing showerhead which performs thin film processing for the substrate on the transport track and comprises at least one or more of a source gas supply module, a purge gas supply module, a reaction gas supply module, and a gas exhaust module; and one or more transporters, each of which supports the susceptor, transports the susceptor along the transport track while floating with respect to the track and not contacting the track, and controls a height of the susceptor to adjust the distance from the substrate to the showerhead, wherein the showerhead is provided with a plurality of nozzle heads, and comprises gas path switching valves each of which allows a gas of a gas reservoir to move toward the substrate when the susceptor enters under the showerhead and allows the gas of the gas reservoir to move to a bypass provided in a body of each of the nozzle heads when the susceptor is away from the showerhead.

2. The thin film processing apparatus of claim 1, wherein the transporter has a structure of a magnetic levitation-type linear motor.

3. The thin film processing apparatus of claim 2, wherein the transporter comprises a moving part provided on the susceptor and a static part provided on the track.

4. The thin film processing apparatus of claim 1, wherein the transporters comprises a horizontal driving part and a vertical driving part to adjust a position of the susceptor in a horizontal direction and a vertical direction, respectively.

5. The thin film processing apparatus of claim 1, wherein a position detection sensor is provided in the susceptor to detect a position of the susceptor inside the chamber.

6. The thin film processing apparatus of claim 1, wherein a magnetic bumper is provided in the susceptor to prevent a collision with another susceptor using magnetic repulsion.

7. The thin film processing apparatus of claim 1, wherein the transporter comprises a support part which supports the susceptor so that the susceptor is circularly transported.

8. The thin film processing apparatus of claim 7, wherein the support part is provided with a slider assembly which allows the susceptor to reciprocate in one direction, and the slider assembly comprises a guide plate fixed below the susceptor and a sliding base to which the guide plate is slidably coupled.

9. The thin film processing apparatus of claim 1, wherein a main gas passage, which allows the gas of the reservoir to move toward the substrate, and a gas path, which is connected to the main gas passage and allows the gas to move to the bypass, are provided inside the gas path switching valve.

* * * * *